(12) United States Patent
Ohga et al.

(10) Patent No.: US 6,278,509 B1
(45) Date of Patent: Aug. 21, 2001

(54) DISPLAY DEVICE HAVING PARTICULAR RIBS BETWEEN TCPS

(75) Inventors: Masaaki Ohga, Tenri; Hisao Kawaguchi, Nara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/047,510

(22) Filed: Mar. 25, 1998

(30) Foreign Application Priority Data

Mar. 26, 1997 (JP) .................................................... 9-073964

(51) Int. Cl.$^7$ ................................................ G02F 1/1345
(52) U.S. Cl. ............................ 349/150; 349/149; 349/152
(58) Field of Search .................................. 349/150, 149, 349/152, 151

(56) References Cited

U.S. PATENT DOCUMENTS 5,402,255 * 3/1995 Nakanishi et al. .................... 349/149
5,805,249 * 9/1998 Hasegawa et al. ................... 349/149
5,897,188 * 4/1999 Sasuga et al. ....................... 349/149

FOREIGN PATENT DOCUMENTS 4359221    11/1992  (JP) .
5-173166    7/1993  (JP) .

* cited by examiner

*Primary Examiner*—Toan Ton
(74) *Attorney, Agent, or Firm*—Nixon & Vanderhye, P.C.

(57) ABSTRACT

The display device of this invention includes: a display panel; a printed circuit board; a plurality of tape carrier packages each having a first side, a second side, an output terminal group located near the first side, and an input terminal group located near the second side; and a chassis having a plurality of ribs for fixing the display panel, wherein the output terminal group of each of the plurality of tape carrier packages is connected with the display panel, the input terminal group of each of the plurality of tape carrier packages is connected with the printed circuit board, the first side of each of the plurality of tape carrier packages is shorter than the second side of each of the plurality of tape carrier packages, and at least one rib of the plurality of ribs is located between the plurality of tape carrier packages.

5 Claims, 10 Drawing Sheets

DISPLAY DEVICE HAVING PARTICULAR RIBS BETWEEN TCPS

BACKGROUND OF THE INVENTION

1. Field of the Invention

The present invention relates to a display device such as a liquid crystal display device used for information apparatus, home electrical appliances, and the like.

2. Description of the Related Art

With a recent growth of an information-oriented society, liquid crystal display devices have attracted increasing attention as display devices to be incorporated in information apparatus and home electrical appliances. This is because liquid crystal display devices are advantageous in that they are thin, light in weight, and operable with low power consumption.

FIG. 7 shows a conventional liquid crystal display device, and FIG. 8 shows a sectional view taken along line C–C' of FIG. 7. The illustrated conventional liquid crystal device includes a liquid crystal panel 1 and a circuit board provided at the periphery of the liquid crystal panel 1 for driving pixels. The liquid crystal panel 1 includes a pair of substrates 1a and 1b each having an electrode and a liquid crystal layer interposed between the pair of substrates 1a and 1b. The circuit board includes a plurality of tape carrier packages (TCPs) 12 arranged in parallel, each of which includes an integrated circuit (IC) 3 for driving lines and pixels mounted on a flexible base. An output terminal group of each TCP is connected with the liquid crystal panel 1 via an anisotropic conductive film (ACF) 7, while an input terminal group thereof is connected with a printed board 4 via an ACF or a solder 8. The liquid crystal panel 1 is fixed to a chassis 5 with ribs 6a provided at the four corners of the liquid crystal panel 1.

In order to realize further enhanced image quality and fineness for the liquid crystal display devices, the demand for reductions in pixel size has all the more increased. As the size of the pixels is reduced, the pixel pitch also needs to be smaller. This makes it extremely difficult to connect the liquid crystal panel 1 with the circuit board (i.e., the TCPs and the like) disposed at the periphery of the liquid crystal panel 1. More specifically, as the pixel pitch of the liquid crystal panel 1 becomes smaller, the area of pixels which can be driven by one IC 3 becomes smaller, and thus the width of the input terminal group of the TCP 12 which includes the IC 3 is smaller. As the width of the input terminal group of the TCP 12 is smaller, the area of the TCP 12 which is in contact with the ACF or solder 8 is smaller. This makes it difficult to connect the TCP 12 with the printed board 4.

In order to overcome the above problem, Japanese Laid-Open Publication No. 5-173166 discloses a liquid crystal display device as shown in FIG. 9. In this conventional liquid crystal display device, the width of the input terminal side of each of TCPs 30a and 30b is different from the width of the output terminal side thereof. Moreover, the input terminal sides of the adjacent TCPs 30a and 30b are alternately shifted from each other, forming a zig-zag array. In this way, the width of the input terminal groups of the TCPs 30a and 30b can be made large compared with the width of the TCPs 12 of the uniform shape arranged in a line as shown in FIG. 7. This facilitates the connection of the TCPs 30a and 30b with the printed board 4 via the ACF or solder 8.

However, the conventional liquid crystal display device disclosed in the above-mentioned Japanese Laid-Open Publication No. 5-173166 has the following problem. Since two or more different shapes of TCPs are used, the process for connecting the TCPs is extremely complicated and troublesome. Two or more types of molds are also required to form these different shapes of TCPs.

In view of the foregoing, the objective of the present invention is to provide a display device where the connection between the input terminal group of the TCP and the printed circuit board is prevented from being easily disconnected and thus warping of a display panel is prevented.

SUMMARY OF THE INVENTION

The display device of this invention includes: a display panel; a printed circuit board; a plurality of tape carrier packages each having a first side, a second side, an output terminal group located near the first side, and an input terminal group located near the second side; and a chassis having a plurality of ribs for fixing the display panel, wherein the output terminal group of each of the plurality of tape carrier packages is connected with the display panel, the input terminal group of each of the plurality of tape carrier packages is connected with the printed circuit board, the first side of each of the plurality of tape carrier packages is shorter than the second side of each of the plurality of tape carrier packages, and at least one rib of the plurality of ribs is located between the plurality of tape carrier packages.

In one embodiment of the invention, a length of one of the plurality of ribs which is in contact with a side of the display panel opposing a side which is in contact with the at least one rib is larger than a length of the at least one rib.

In another embodiment of the invention, an electronic component is mounted on the printed circuit board, and the electronic component is located between the plurality of tape carrier packages.

In still another embodiment of the invention, the width of a portion of each of the plurality of tape carrier packages which overlaps the printed circuit board is smaller than the length of the second side so that a space for disposing an electronic component is secured.

In still another embodiment of the invention, the distance between the input terminal group of one of the plurality of tape carrier packages and the input terminal group of another one adjacent to the one of the plurality of tape carrier packages is shorter than the distance between the output terminal group of the one of the plurality of tape carrier packages and the output terminal group of the another one adjacent to the one of the plurality of tape carrier packages.

According to the present invention, the width of the output terminal side of each TCP which is connected with the substrate of the display panel is smaller than the width of the input terminal side thereof which is connected with the printed board. At least one rib for fixing the display panel is provided between the output terminal sides of the adjacent TCPs. This increases the strength for supporting the display panel and prevents the display panel from warping even if the size of the display screen is made large.

Since the width of the input terminal side of each TCP is larger than the width of the output terminal side thereof, the terminal pitch on the input terminal side can be increased. This increases the area of the TCP which is in contact with the ACF or solder, thereby facilitating the connection of the TCP with the printed board.

Since the width of the input terminal side of each TCP is large, the number of terminals on the input terminal side can be increased. This makes it possible to employ a signal input method called a two-port input method where the transfer frequency is halved and thus unnecessary radiation can be suppressed.

By arranging the TCPs in parallel so that the input terminal sides of the adjacent TCPs are close to each other, the width of the input terminal sides can be made large. This allows for a large terminal pitch or an increased number of terminals on the input terminal side By forming a narrow portion of the TCP continuing from the output terminal side to an area of a predetermined range which overlies the printed board, spaces can be secured between the narrow portions of the adjacent TCPs on the printed board. Electronic components may be mounted at such spaces, thereby realizing effective use of otherwise unused spaces on the printed board.

Thus, the invention described herein makes possible the advantage of providing a display device where the connection between the input terminal group of the TCP and the printed circuit board is prevented from being easily disconnected and thus warping of a display panel is prevented.

This and other advantages of the present invention will become apparent to those skilled in the art upon reading and understanding the following detailed description with reference to the accompanying figures.

DESCRIPTION OF THE PREFERRED EMBODIMENTS

Figure 1:
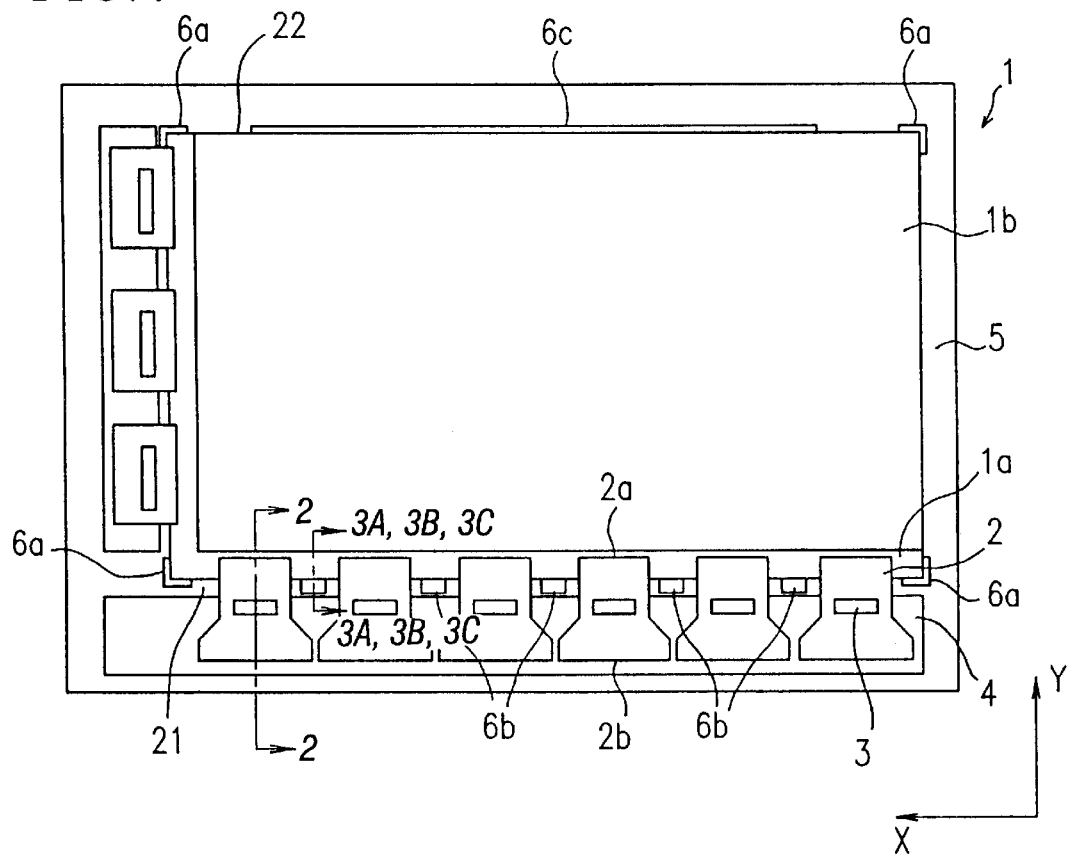
FIG. 1 is a plan view of a liquid crystal display device of Example 1 according to the present invention.

The present invention will be described by way of examples with reference to the accompanying drawings. Components having the same functions as those of the above-described conventional liquid crystal display devices are denoted by the same reference numerals.

EXAMPLE 1

Figure 2:
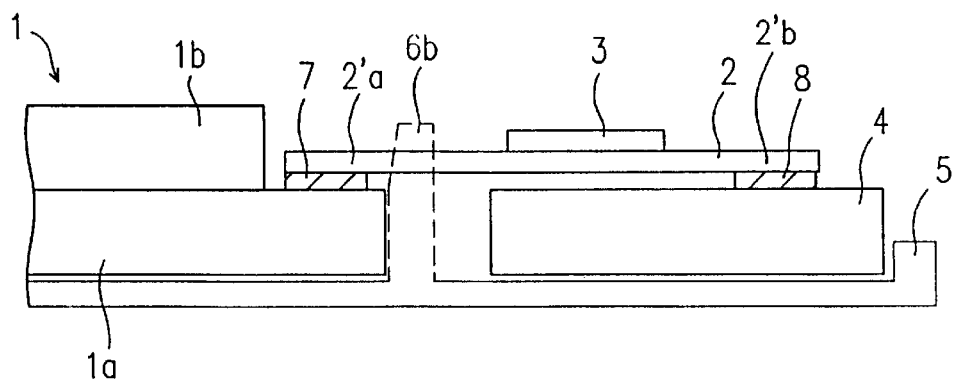
FIG. 2 is a sectional view of the liquid crystal display device of Example 1, taken along line A–A' of FIG. 1.

FIG. 1 is a plan view of a liquid crystal display device of Example 1 according to the present invention. FIG. 2 is a sectional view of the liquid crystal display device, taken along line A–A' of FIG. 1. In FIG. 2, a rib 6b shown by a broken line which is actually located at the section along line B–B', not line A–A', is shown behind a TCP 2, i.e., in the inner side as is viewed from FIG. 2.

The liquid crystal display device of this example includes a liquid crystal panel 1, a printed circuit board 4, a plurality of tape carrier packages (TCPs) 2 each having a first side 2a, a second side 2b opposing the first side 2a, an output terminal group 2'a located near the first side 2a, and an input terminal group 2'b located near the second side 2b, and a chassis 5 having a plurality of ribs 6a, 6b, and 6c for fixing the liquid crystal panel 1.

The liquid crystal panel 1 includes a pair of substrates 1a and 1b and a liquid crystal layer (not shown) interposed between the pair of substrates 1a and 1b. Each of the TCPs 2 includes a flexible base, wirings (not shown) running in or on the flexible base, and an integrated circuit (IC) 3 for driving pixels. The plurality of TCPs 2 with such a structure are arranged in parallel. The output terminal group 2'a of each of the plurality of TCPs 2 is connected with the liquid crystal panel 1 via an ACF 7. The input terminal group 2'b of each of the TCPs 2 is connected with the printed circuit board 4 via an ACF or a solder 8. The TCPs 2 arranged along the same side of the liquid crystal panel 1 are the same in shape.

In each of the TCPs 2 arranged along a lower side 21 of the liquid crystal panel 1, the second side 2b is longer than the first side 2a. Therefore, the terminal pitch of the input terminal group 2'b located near the second side 2b is allowed to be larger than the terminal pitch of the output terminal group 2'a located near the first side 2a. The ribs 6b are provided between the adjacent TCPs 2 so that they are located between the liquid crystal panel 1 and the printed circuit board 4. The second sides 2b of the adjacent TCPs 2 are close to each other, with a gap therebetween of about 0.2 mm to about 0.5 mm, for example.

The ribs 6a are disposed on the chassis 5 at positions which are in contact with the four corners of the liquid crystal panel 1. A rib 6c is disposed on the chassis 5 at a position which is in contact with an upper side 22 of the liquid crystal panel 1. The length of the rib 6c in the X direction is larger than the length of the ribs 6b. Alternatively, the liquid crystal panel 1 may be fixed with only the four ribs 6a and the plurality of ribs 6b. When the rib 6c is used together with the plurality of ribs 6b, the ribs 6a which are in contact with the two lower corners of the liquid crystal panel 1, rather than all four corners thereof, may be disposed on the chassis 5.

The ribs 6b may be formed of a material which does not damage the liquid crystal panel 1, such as plastic. The construction of the ribs 6b will be described as follows with reference to FIGS. 3A to 3C.

Figure 3A:
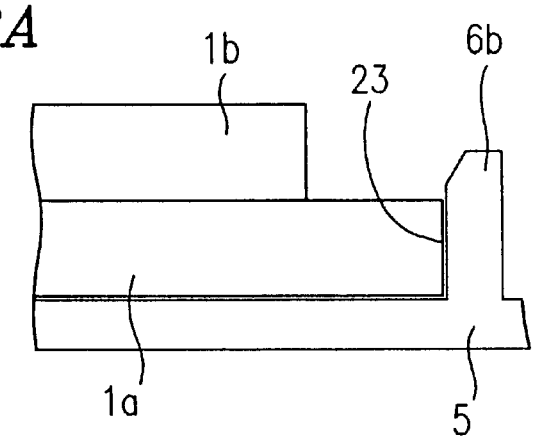
FIGS. 3A to 3C are sectional views of the liquid crystal display device of Example 1, taken along line B–B' of FIG. 1, illustrating different types of ribs according to the present invention.
Figure 3B:
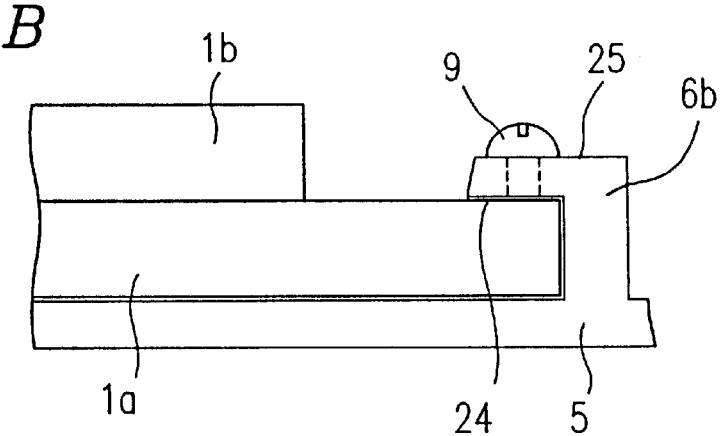
Figure 3C:
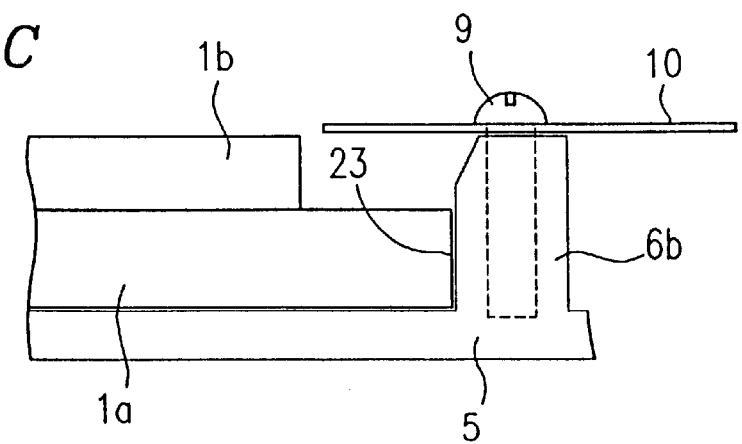

FIGS. 3A to 3C are sectional views of the liquid crystal display device, taken along ling B–B' of FIG. 1, illustrating three different exemplified constructions of the ribs 6b.

In FIG. 3A, the rib 6b supports a face 23 of the substrate 1a of the liquid crystal panel 1.

In FIG. 3B, a portion 25 of the rib 6b covers a portion 24 of the upper surface of the substrate 1a. The portion 25 of the rib 6b and the portion 24 of the upper surface of the substrate 1a may be fixed to each other with a screw 9.

In FIG. 3C, the rib 6b supports the face 23 of the substrate 1a of the liquid crystal panel 1, and a protective cover 10 which covers a driving circuit portion of the liquid crystal display device is fixed to the rib 6b with a screw 9.

According to the liquid crystal display device of this example, since the ribs 6b are disposed between the adjacent TCPs 2, enhanced vibration resistance and shock resistance can be obtained even if the liquid crystal panel is large. For example, in the case of a liquid crystal panel with a display screen size of about 12 inches or larger, the load on the liquid crystal panel will be biased if the ribs are provided only at the four corners of the liquid crystal panel. The load on the liquid crystal panel can be dispersed by providing the ribs 6b along the lower side of the liquid crystal panel. This increases the strength for supporting the liquid crystal panel and prevents the liquid crystal panel from warping. According to the liquid crystal display device of this example, therefore, the liquid crystal panel 1 is prevented from warping, and thus the joint portion between the liquid crystal panel 1 and the printed circuit board 4 is prevented from disconnecting. More-over, by arranging the ribs 6b so that the weight of the liquid crystal panel 1 is uniformly dispersed, a display variation called a Newton ring which tends to occur on the periphery of the liquid crystal panel 1 can be suppressed.

The ribs 6b are not necessarily disposed at all the gaps between the adjacent TCPs 2, but may be appropriately disposed at gaps which are considered necessary to support the liquid crystal panel 1.

In the liquid crystal display device of this example, the second side 2b of each of the TCPs 2 is longer than the first side 2a thereof as described above. This allows an increase in the terminal pitch of the input terminal group 2'b connected to the printed circuit board 4. As a result, since the area of the input terminal group 2'b which is in contact with the ACF or solder 8 increases, the connection strength increases while the connection resistance decreases.

Figure 9:
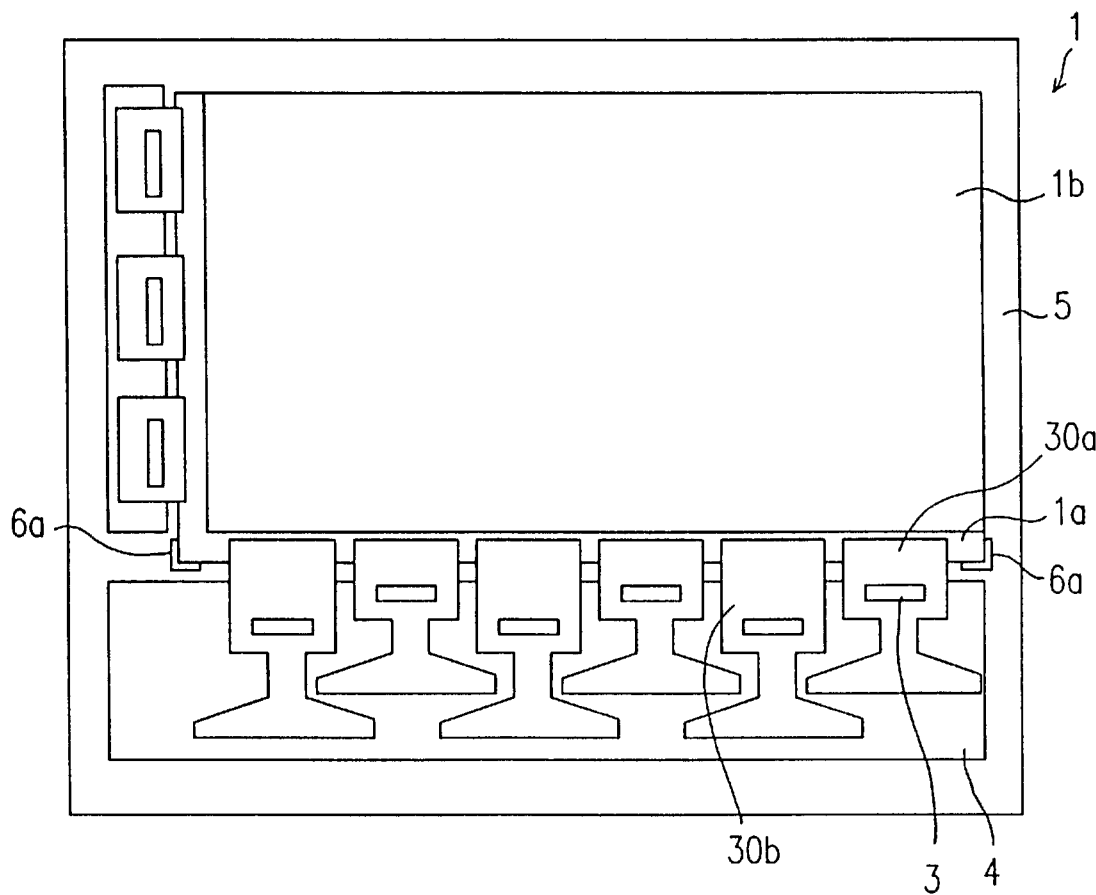
FIG. 9 is a plan view of another conventional liquid crystal display device.

The TCPs 2 disposed along the lower side of the liquid crystal panel 1 have a shape of the combination of one trapezoid and two different rectangles. This shape is not as complicated as the shape of the TCPs 30a and 30b of the conventional liquid crystal display device show n in FIG. 9. Therefore, the probability of the disconnection of the TCPs 2 of this shape in this example is low, compared with the TCPs 30a and 30b of the conventional liquid crystal display device.

By arranging the TCPs 2 of the same shape along the same side of the liquid crystal panel, a complicated connecting process and a cost increase of the resultant device are avoided.

By arranging the TCPs 2 in parallel so that the second sides 2b of the adjacent TCPs 2 are close to each other, the area of the display device other than the actual display portion can be reduced. Alternatively, the second sides 2b of the TCPs 2 may b e enlarged.

In the liquid crystal display device of this example, since the second side 2b of each of the TCPs 2 is longer than the first side 2a thereof as described above, a signal input method called a two-port input method can b e employed.

In a normal signal input method, a signal of a total of 18 bits, i.e., six bits for each of the three colors, R (red), G (green), and B (blue), is transferred every signal input to the TCPs. On the contrary, in the two-port signal input method, a 36-bit signal is transferred every signal input to the TCPs, conveying an amount of information which is double that available in the normal signal input method.

In the two-port signal input method, therefore, each TCP requires 36 input terminals and wirings corresponding to these input terminals. However, the two-port signal input method has the following advantages over the normal signal input method. First, the frequency required for signal sampling and transfer can be reduced by a half compared with the normal signal input method. Secondly, unnecessary radiation of electromagnetic waves can be suppressed. Thus, the criteria against unnecessary radiation of electromagnetic waves can be satisfied by employing the two-port input method.

The construction of the TCPs 2 driven by the two-port input method will be described.

Figure 4A:
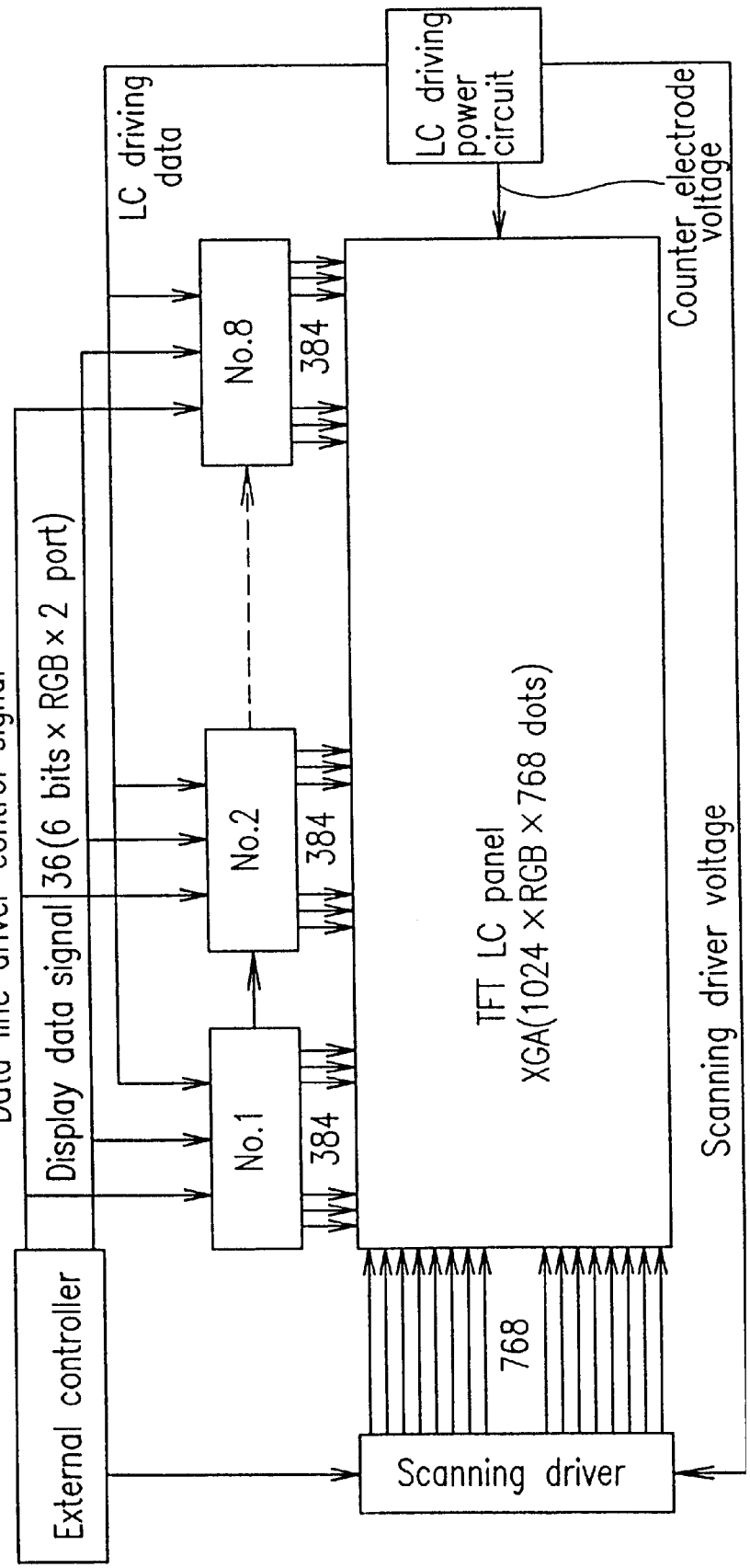
FIG. 4A is a block diagram of a TFT liquid crystal module.

FIG. 4A is a block diagram of a TFT liquid crystal module. In FIG. 4A, a TFT liquid crystal panel having a level of resolution called XGA is shown.

The liquid crystal panel includes 1024×RGB=3072 columns with respect to data signal lines and 768 rows with respect to scanning signal lines. TFTs are arranged at the crossings of the columns and the rows. Eight TCPs 2 each of which outputs 384 output signals are arranged along a side of the liquid crystal panel with respect to the data signal lines. An external controller generates display data signals and driver control signals. Each of the TCPs 2 receives the display data signals in response to the driver control signals. The received display data signals are output from the TCP 2 as voltage signals to be supplied to the TFTs.

Figure 4B:
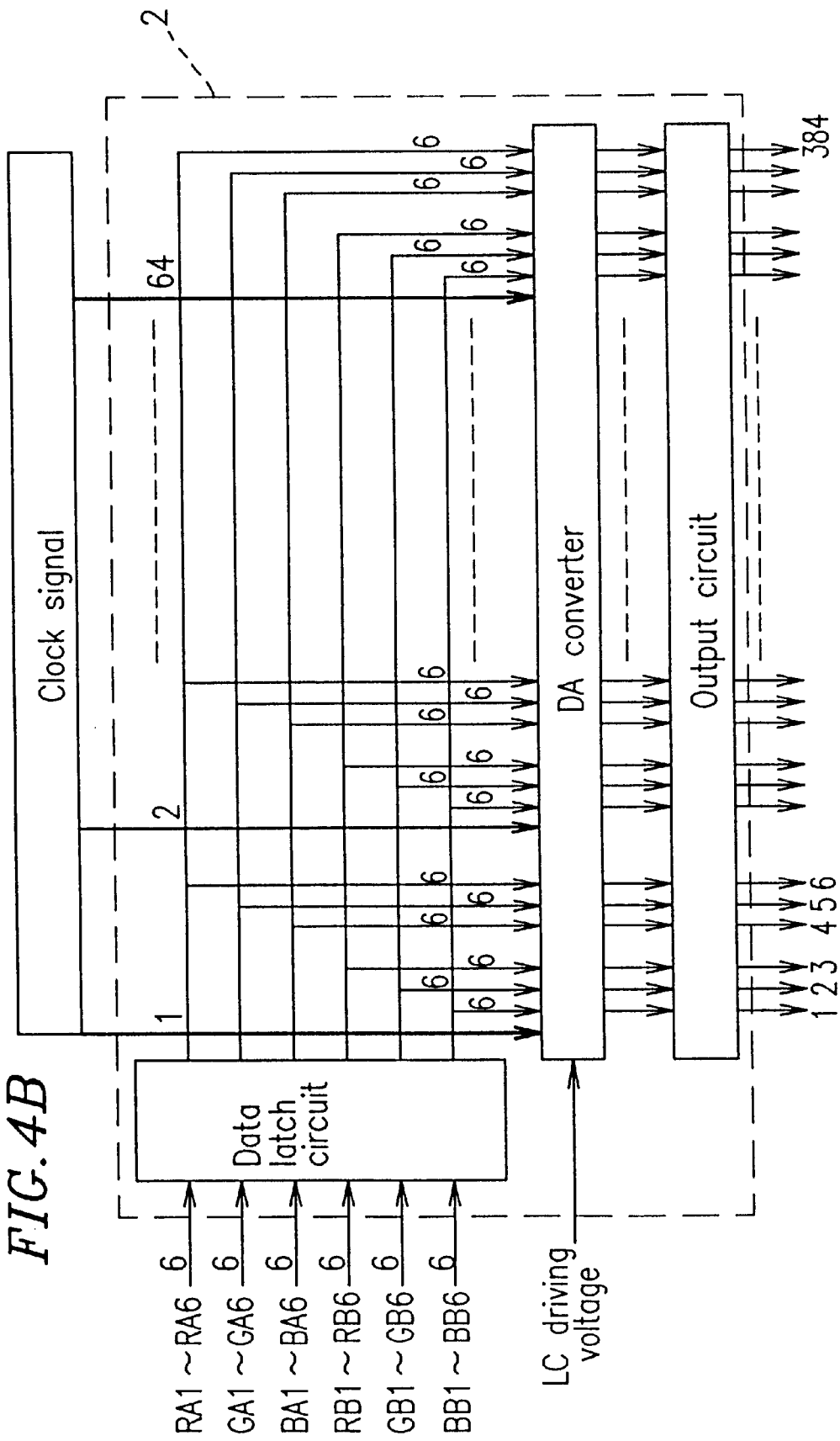
FIG. 4B is view illustrating the construction of a TCP driven by a two-port input method.

FIG. 4B shows the construction of the TCP 2 driven by the two-port input method. The TCP 2 shown in FIG. 4B includes a data latch circuit, a D/A converter, and an output circuit. The data latch circuit receives display data signals of a total of 36 bits, i.e., 6 bits×RGB×2 dots (RA1 to RA6, GA1 to GA6, BA1 to BA6, RB1 to RB6, GB1 to GB6, and BB1 to BB6) at one time, and latches these display data signals. The latched display data signals are sequentially transferred to the D/A converter via a clock signal, where the transferred display data signals are held and quantized. The holding time is substantially equal to the period of one clock signal, and the maximum value of the quantized signals is substantially equal to a liquid crystal driving voltage. The held and quantized signals are output via the output circuit. When the number of signals output from each TCP 2 is 384, 384 data pieces are generated during 64 clock signals.

Figure 4C:
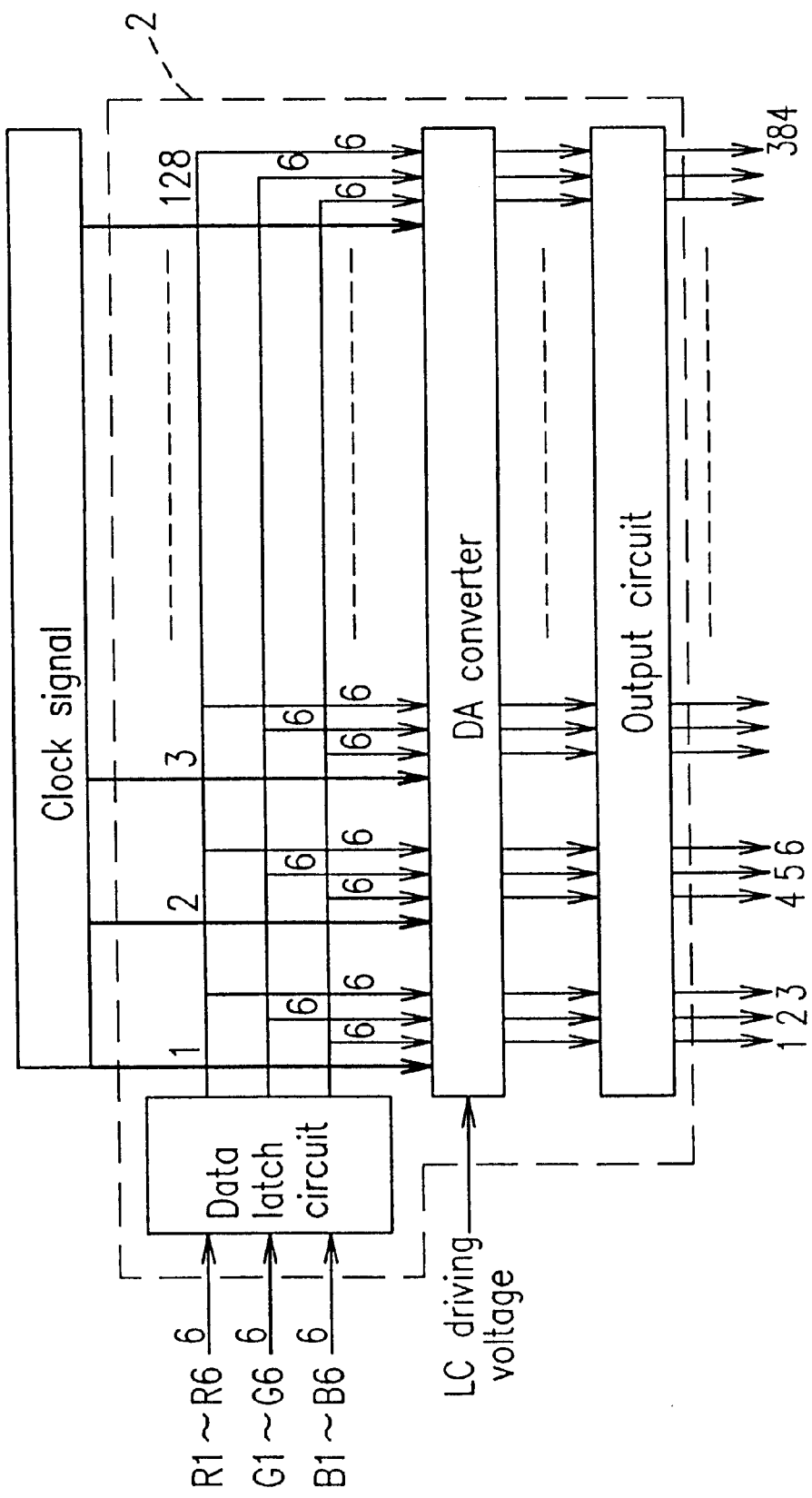
FIG. 4C is a view illustrating the construction of a TCP driven by a one-port input method.

FIG. 4C shows the construction of the TCP 2 driven by the one-port input method. The TCP 2 includes a data latch circuit, a D/A converter, and an output circuit. The data latch circuit receives display data signals of a total of 18 bits, i.e., 6 bits×RGB (R1 to R6, G1 to G6, and B1 to B6) at one time, and latches these display data signals.

In the TCP 2 shown in FIG. 4C, in comparison with the TCP 2 shown in FIG. 4B, since the data of 18 bits are input at one time, 128 clock signals are required to output all the signals from the TCP 2, which is double that required in the case of the TCP 2 shown in FIG. 4B.

Figure 5:
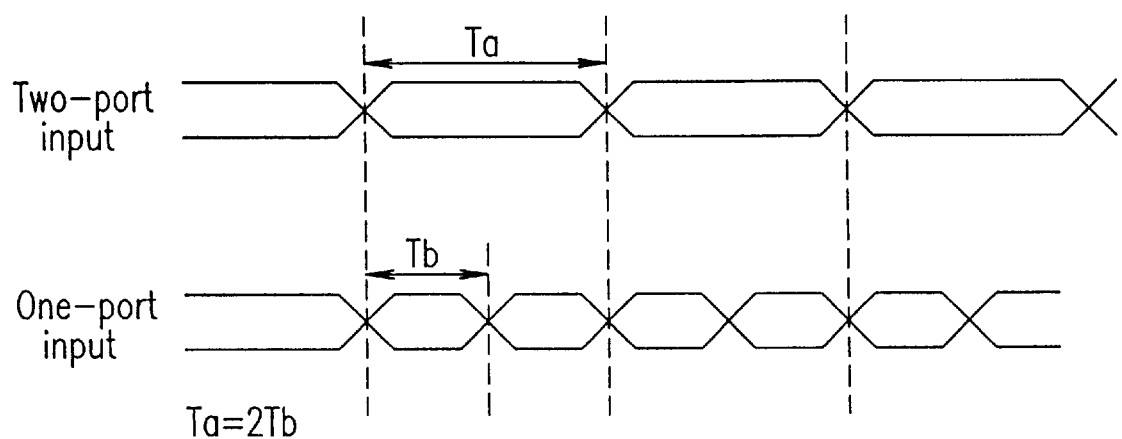
FIG. 5 is a waveform chart showing the lengths of one clock in the two-port input method and the one-port input method.

If the frequency for driving the liquid crystal panel is the same, the TCP 2 shown in FIG. 4C (driven by the one-port input method) is required to transfer data therein at a rate double that required for the TCP 2 shown in FIG. 4B (driven by the two-port input method). FIG. 5 illustrates the lengths of one clock signal in the two-port input method and the one-port input method.

EXAMPLE 2

Figure 6:
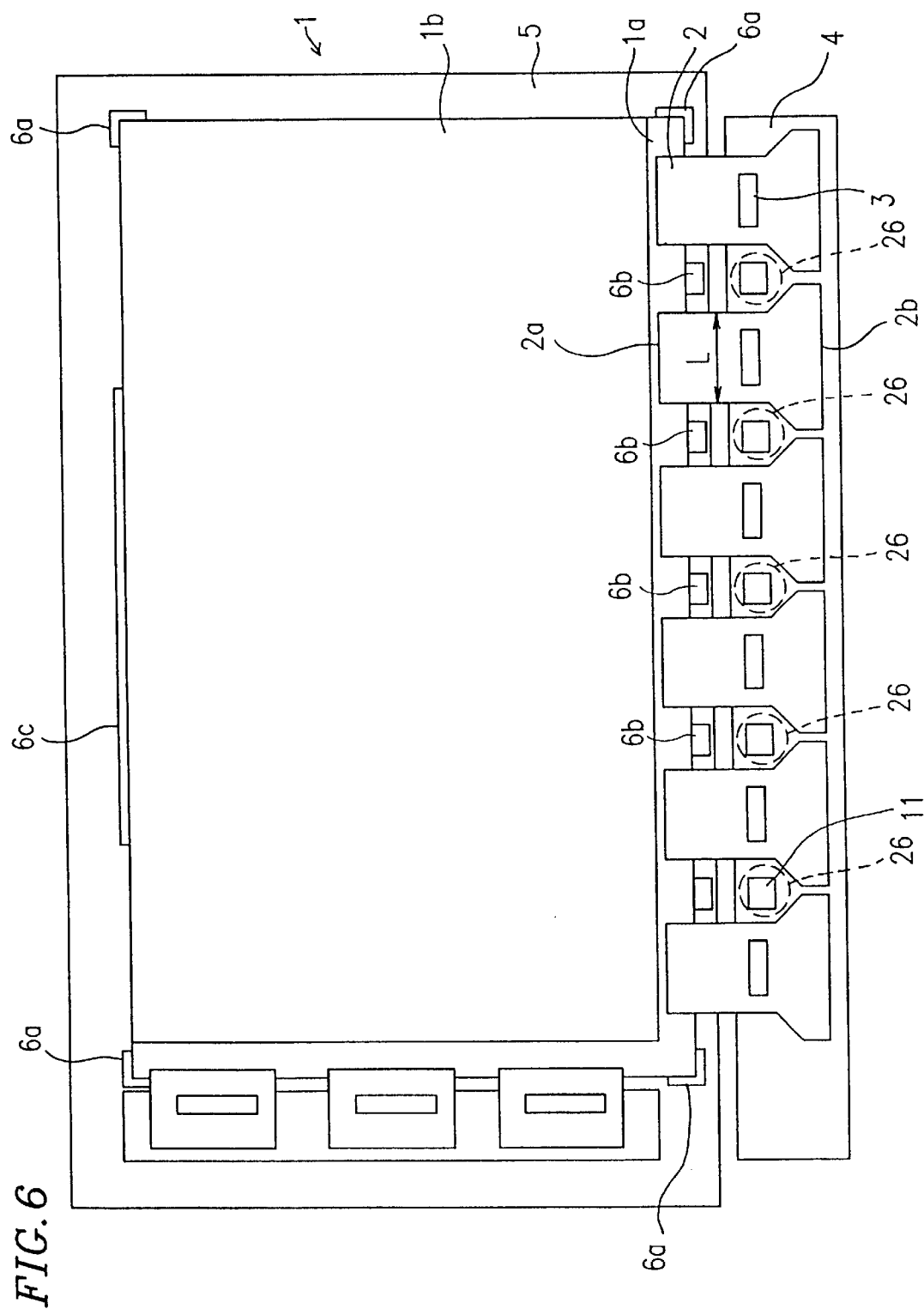
FIG. 6 is a plan view of a liquid crystal display device of Example 2 according to the present invention.
Figure 7:
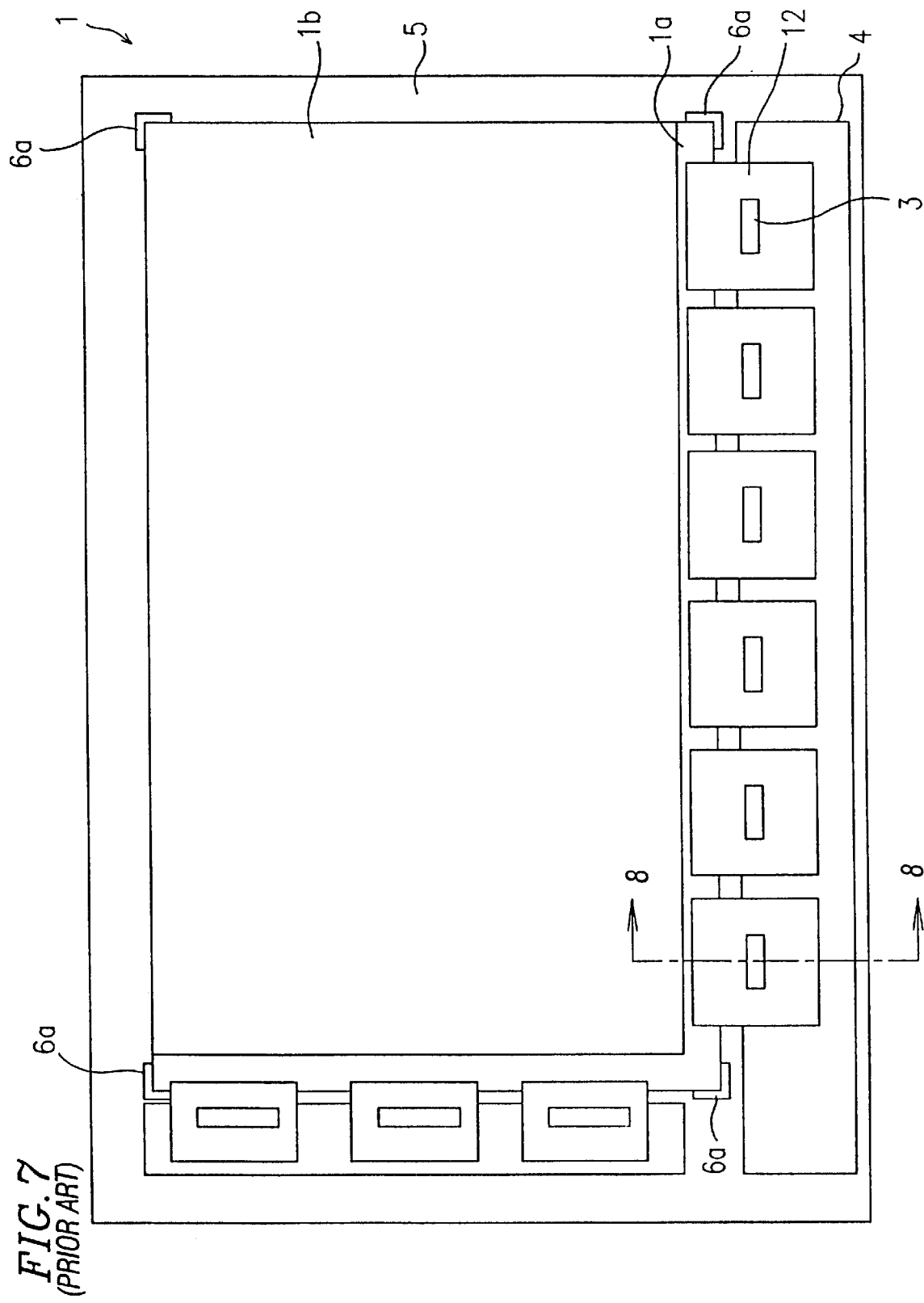
FIG. 7 is a plan view of a conventional liquid crystal display device.
Figure 8:
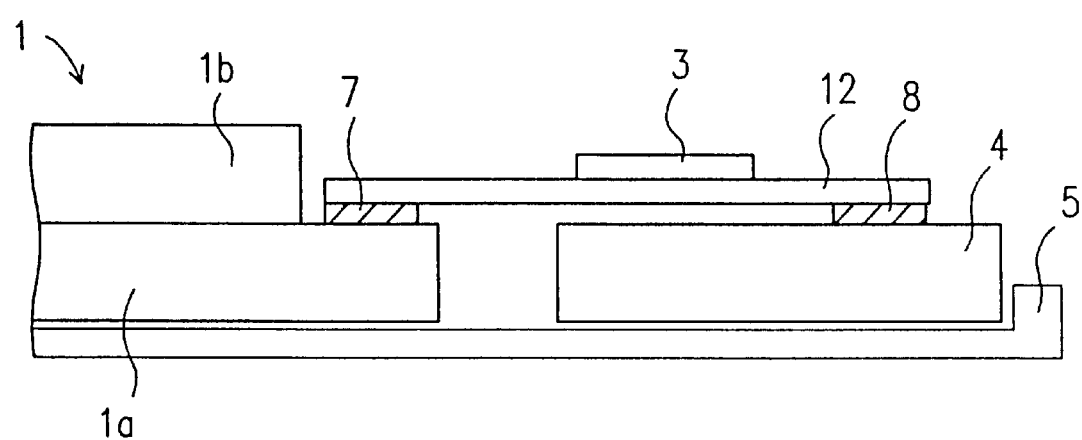
FIG. 8 is a sectional view of the conventional liquid crystal display device, taken along line C–C' of FIG. 7.

FIG. 6 is a plan view of a liquid crystal display device of Example 2 according to the present invention.

In the liquid crystal display device of this example, circuit components 11 such as capacitors and resistors are disposed on the printed circuit board 4 at gaps 26 between the adjacent TCPs 2. In order to dispose the circuit components 11 at the gaps 26 on the printed circuit board 4, a width L of a portion of the TCP 2 which overlaps the printed circuit board 4 is made smaller than the length of the second side 2b of the TCP 2. For example, the width L may be substantially the same as the length of the first side 2a.

Thus, in the liquid crystal display device of this example, empty spaces on the printed circuit board 4 can be effectively used, and thus the area of the printed circuit board 4 can be reduced.

In the liquid crystal display devices of Examples 1 and 2, the TCPs 2 may be folded so that the printed circuit board 4 is disposed on the bottom surface of the substrate 1a of the liquid crystal panel 1. This reduces the area of the liquid crystal display device outside the actual display portion.

In the above examples, the present invention was described as being applied to the liquid crystal display device. It would be appreciated, however, that the present invention is widely applicable to display devices in general which use materials other than liquid crystal as the display media. The present invention is also applicable to display devices driven by, not only the two-port input method, but also input methods using three or more ports as long as the number of terminals and the number of wirings are increased accordingly.

In the above examples, although the TCPs are connected to only one of the two opposite sides of the liquid crystal panel, they may be connected to the two opposite sides thereof. Although the TCPs are shown in FIGS. 1 and 6 to be located on the lower side as is viewed from the figures, they may be located on the upper side. In the latter case, also, the vibration resistance and the shock resistance increase, providing the same effects as those described above.

Thus, according to the display device of the present invention, the output terminal group of each of the plurality of tape carrier packages (TCPs) is connected with the display panel, and the input terminal group thereof is connected with the printed circuit board. At least one of the plurality of ribs is disposed between the adjacent TCPs. This increases the strength for supporting the display panel even if the display panel is large. As a result, the display panel is prevented from warping, the occurrence of a display difference on the periphery of the display panel is minimized, and the display quality of the resultant display device is improved.

The second side of each of the plurality of TCPs is longer than the first side thereof. This means that the terminal pitch of the input terminal group of the TCP is larger than the terminal pitch of the output terminal group thereof. This increases the area of the portion of the TCP which is in contact with the ACF or solder, and thus prevents the connection between the input terminal group of the TCP and the printed circuit board from being easily disconnected. As a result, the connection strength between the TCP and the printed circuit board increases, while the connection resistance therebetween decreases. This enhances the durability and reliability of the display device according to the present invention.

The second side of each of the plurality of TCPs is longer than the first side thereof as described above. This means that the number of terminals of the input terminal group can be larger than the number of terminals of the output terminal group. As a result, the display device according to the present invention is allowed to be driven by the two-port input method, thereby suppressing unnecessary radiation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A display device comprising: a display panel; a printed circuit board; a plurality of tape carrier packages arranged substantially in parallel, each having a first side, a second side, an output terminal group located near the first side, and an input terminal group located near the second side; and a chassis having a plurality of ribs for fixing the display panel, wherein the output terminal group of each of the plurality of tape carrier packages is connected with the display panel, the input terminal group of each of the plurality of tape carrier packages is connected with the printed circuit board, the first side of each of the plurality of tape carrier packages is shorter than the second side of each of the plurality of tape carrier packages, and at least one rib of the plurality of ribs is located between portions of the plurality of tape carrier packages containing the first sides.

2. A display device according to claim 1, wherein an electronic component is mounted on the printed circuit board, and the electronic component is located between the plurality of tape carrier packages.

3. A display device according to claim 1, wherein a width of a portion of each of the plurality of tape carrier packages which overlaps the printed circuit board is smaller than a length of the second side so that a space for disposing an electronic component is secured.

4. A display device according to claim 1, wherein a distance between the input terminal group of one of the plurality of tape carrier packages and the input terminal group of another one adjacent to the one of the plurality of tape carrier packages is shorter than the distance between the output terminal group of the one of the plurality of tape carrier packages and the output terminal group of the another one adjacent to the one of the plurality of tape carrier packages.

5. A display device comprising: a display panel; a printed circuit board; a plurality of tape carrier packages arranged substantially in parallel, each having a first side, a second side, an output terminal group located near the first side, and an input terminal group located near the second side; and a chassis having a plurality of ribs for fixing the display panel, wherein the output terminal group of each of the plurality of tape carrier packages is connected with the display panel, the input terminal group of each of the plurality of tape carrier packages is connected with the printed circuit board, the first side of each of the plurality of tape carrier packages is shorter than the second side of each of the plurality of tape carrier packages, and at least one rib of the plurality of ribs is located between portions of the plurality of tape carrier packages containing the first sides, and wherein a length of one of the plurality of ribs which is in contact with a side of the display panel opposing a side which in contact with the at least one rib is larger than a length of the at least on rib.

* * * * *